United States Patent [19]

Moshfeghi

[11] Patent Number: 5,303,706
[45] Date of Patent: Apr. 19, 1994

[54] DIRECTIONAL INTERPOLATION FOR MAGNETIC RESONANCE ANGIOGRAPHY

[75] Inventor: Mehran Moshfeghi, White Plains, N.Y.

[73] Assignee: North American Philips Corporation, New York, N.Y.

[21] Appl. No.: 886,679

[22] Filed: May 21, 1992

[51] Int. Cl.$^5$ ............................................. A61B 5/055
[52] U.S. Cl. .............................. 128/653.2; 364/413.15; 364/413.16; 364/413.18; 364/413.19; 324/306
[58] Field of Search ...................................... 128/653.2; 364/413.15–413.20; 324/306

[56] References Cited

U.S. PATENT DOCUMENTS

| | | | |
|---|---|---|---|
| 4,827,413 | 5/1989 | Baldwin et al. | 364/413.019 |
| 4,866,612 | 9/1989 | Takagi et al. | 364/413.16 |
| 4,879,652 | 11/1989 | Nowak | 364/413.18 |
| 4,894,776 | 1/1990 | Dekel | 364/413.18 |
| 4,907,152 | 3/1990 | Lempriere | 364/413.18 |
| 4,953,087 | 8/1990 | Crawford | 364/413.18 |
| 4,985,834 | 1/1991 | Cline et al. | 364/413.022 |
| 5,031,226 | 7/1991 | Delange | 382/16 |
| 5,079,699 | 1/1992 | Tuy et al. | 364/413.022 |
| 5,148,499 | 9/1992 | Matsumura | 364/413.19 |
| 5,167,232 | 12/1992 | Parker et al. | 324/306 |
| 5,187,660 | 2/1993 | Civanlar et al. | 364/413.019 |

OTHER PUBLICATIONS

"Volume Rendering and Connectivity Algorithms for MR Angiography", by Harvey E. Cline et al, Magnetic Resonance in Medicine 18, pp. 384–394.

"MR Angiography Based on Inflow", by J. P. Groen et al, Philips Medical Systems, Best, The Netherlands, p. 906.

"Shape-based Interpolation", by Gabor T. Herman et al, University of Pennsylvania, May 1992, pp. 69–79.

"Shape-Based Interpolation of Multidimensional Objects", by Sai Prasad Raya et al, IEEE Transactions on Medical Imaging, vol. 9, No. 1, Mar. 1990, pp. 32–42.

"Dynamic Elastic Interpolation for 3-D Medical Image Reconstruction From Serial Cross Sections", by Wei--Chung Lin et al., IEEE Transactions on Medical Imaging, vol. 7, No. 3, Sep., 1988, pp. 225–232.

"Restoring Spline Interpolation of CT Images", by Chin-Hwa Lee, IEEE Transactions on Medical Imaging, vol. M1-2, No 3, Sep. 1983, pp. 142–150.

"Model Guided Automatic Frame-to-Frame Segmentation in Digital Subtraction Angiography", by J. H. Rong et al, Proc. SPIE-The International Society for Optical Engineering, vol. 1137, pp. 31–36 (1989).

Primary Examiner—Lee S. Cohen
Assistant Examiner—Brian L. Casler
Attorney, Agent, or Firm—Jack D. Slobod

[57] ABSTRACT

The staircase artifact appearing in Magnetic Resonance Angiography boundaries between flowing blood and stationary tissue is eliminated by using a variable local interpolation direction which is determined based on comparing local intensity patterns. This technique of local directional interpolation is applied either to a three dimensional array of voxels prior to projection or to a two dimensional array of pixels after projection. In the case of interpolating lines of further pixels between consecutive lines of original pixels, a window of $n_1$ pixels in a present line is compared to successive groups of $n_1$ pixels in a search window of $n_2 \geq n_1$ pixels which groups are successively shifted in position in the search window. A match measure is formed by either a correlation or a root mean squared error (or a combination thereof) between the window and groups compared. The best match with respect to a threshold determines corresponding pixels. In the absence of a match better than the threshold a default vertical direction of interpolation is taken.

20 Claims, 7 Drawing Sheets

DIRECTIONAL INTERPOLATION FOR MAGNETIC RESONANCE ANGIOGRAPHY

BACKGROUND OF THE INVENTION

1. Field of the Invention

The present invention relates to angiography wherein a two dimensional array of pixels for display as an angiogram is determined from a three dimensional array of voxels computed from signal samples of radiation due to flowing blood in a region of a body under examination. In its particular aspects, the present invention relates to interpolation methods of providing an increased apparent resolution in the angiogram.

2. Background of the Invention

Display algorithms for rendering three-dimensional Magnetic Resonance Angiography (MRA) data in two-dimensional form are known from H. Cline et al, "Volume Rendering and Connectivity Algorithms for MR Angiography" Magn. Res. Med. 18, pp. 384–394 (1991).

Angiography of the type mentioned is presently carried out by operating magnetic resonance imaging (MRI) apparatus in a mode employing a magnetic resonance angiography (MRA) technique in which a three dimensional data set of voxels exhibiting enhanced contrast to flowing blood is post-processed to display the vascular area of interest. Time-of-flight techniques for both 2D and 3D collections and 3D phase-contrast techniques are known for enhancing the contrast of flowing blood relative to stationary tissue. In the 2D time-of-flight method, a collection of spin resonance signals for multiple parallel slices is obtained. The flow sensitive contrast is due to substantially saturating stationary spins in the slice from which spin resonance signals are collected by relatively rapid repetition of close to 90° flip angle slice selective RF excitation pulses so that only unsaturated spins in blood flowing into the slice have relatively strong longitudinal magnetization just prior to the excitation pulses. This induces high intensity spin resonance signals from the inflowing blood, which intensity increases with the amount of inflow velocity component normal to the slice. A three dimensional data set of voxel intensities is computed by two dimensional Fourier transformation for each slice of samples of the spin resonance signals received during a read gradient for sequences repeated with different phase encoding gradient integrals. In the 3D time-of-flight method and in the 3D phase-contrast method a three dimensional data set of spin resonance samples are obtained from which the three dimensional data set of voxel intensities is obtained by three dimensional Fourier transformation.

Irrespective of the technique employed to obtain the three dimensional data set of voxel intensities, a rendering of this data set for viewing purposes to a two dimensional data set of pixels is necessary. This is done typically by forming a projection in a viewing direction. The most widely used projection method is maximum intensity projection (MIP). With this method, which is computationally fast, parallel rays are projected through the three dimensional data set in a viewing direction, a different ray being associated with each pixel, and the maximum intensity of voxels along each each ray is taken as the intensity of the associated pixel.

If the center to center spacing in one of three mutually orthogonal directions, e.g. between adjoining voxels in different slices of a multislice collection, is larger than that between adjoining voxels in the other directions, it is common to provide additional apparent resolution in the slice direction by interpolation. Interpolation is usually applied prior to projection increasing the number of planes of voxels in order to produce an expanded three dimensional data set with substantially cubic voxels. Alternatively, interpolation can be applied to the two dimensional pixel array produced by projection to expand the number of lines quantizing the slice direction.

Both interpolation techniques produce an objectional staircase artifact along the boundaries between flowing blood and stationary tissue when blood vessels are oriented obliquely with respect to the principal directions of the voxel spacings. This is because conventional interpolation techniques utilize a constant direction of interpolation which is aligned with one of the principle axes of the voxel array.

SUMMARY OF THE INVENTION

It is an object of the present invention to provide an angiography method using an interpolation technique which substantially minimizes or eliminates production of the staircase artifact. It is a further object of the present invention to provide techniques for interpolation, either before or after projection, where local directions of interpolation are determined which tend to be along actual or projected longitudinal axes of oblique blood vessels. It is still another object of the invention that said local directions of interpolation be determined in a computationally efficient manner not necessitating actual labelling of pixels or voxels corresponding to flowing blood or vessel inner walls.

Briefly, the above objects are satisfied by providing an angiography method of the type where interpolation is done after projection of the three dimensional array of voxels into a preliminary two dimensional array of pixels as a function of the positions and intensities of the measured voxels. In such instance, additional lines of pixels are interpolated between parallel lines of pixels in the preliminary two dimensional array in forming an expanded two dimensional pixel array for display as an angiogram. In accordance with the invention, such interpolating is carried out by determining for each pixel in a first line whether a pixel exists in an adjoining parallel said second line which corresponds in position to the pixel in the first line with respect to intensity patterns in the lines, which are due to any proximate cardiovascular structure, and by using a local direction of interpolation directed between the pixel in said first line and a pixel in the second line determined to correspond thereto, and in the absence of a pixel in the second line determined to correspond thereto using a local direction of interpolation along a perpendicular to said first and second lines.

Where the angiography method is such that interpolation is done prior to projection, which may be preferable if a plurality of projections in different viewing directions are to be produced, then additional planes of voxels are interpolated between voxels of the three dimensional array to form an expanded three dimensional array to which the projection algorithm is applied. In this instance the determination of correspondence relative to intensity patterns is between voxels in adjoining parallel planes, and the local interpolation direction, in the case of correspondence, may have components in the three principal directions of the voxel array.

The determination of correspondence is by forming a match measure which is a function of the intensities of a first group of contiguous pixels or voxels, in a first line or plane, including the pixel or voxel, in a predetermined relative position such as center, for which a corresponding pixel or voxel in the second line or plane is sought, and second groups of contiguous pixels or voxels, which second groups are successively shifted in position in said second line or plane. Correspondence is determined with respect to pixel or voxel in the same predetermined relative position in that second group, if any, which yields the optimum match measure better than a predetermined threshold value. The match measure is taken as a root mean squared difference of intensities of the first and second groups, a correlation coefficient of the intensities and average intensities of the first and second groups, or a weighted combination of these alternatives.

Where no match measure is better that the predetermined threshold, the local direction of interpolation is taken, as in the prior art, perpendicular to the interpolated line of pixels or normal to the interpolated plane of voxels.

Other objects, features and advantages of the present invention will become apparent upon study of the following detailed description when taken in conjunction with the appended drawing wherein:

DETAILED DESCRIPTION OF THE PREFERRED EMBODIMENT

Figure 1:
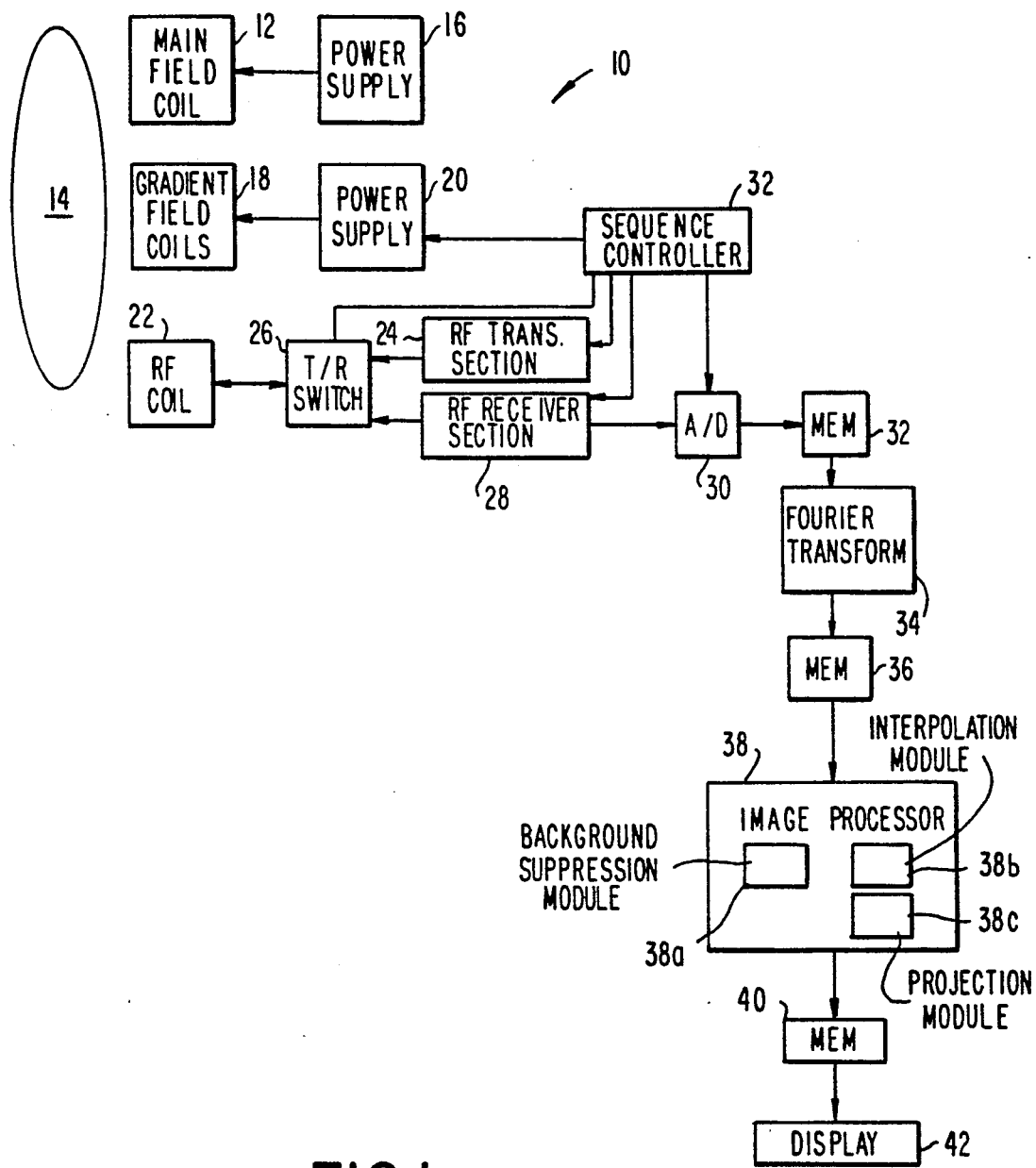
FIG. 1 is a simplified schematic of magnetic resonance imaging apparatus usable for implementing the present invention.

FIG. 1 of the drawing shows a simplified schematic of a magnetic resonance imaging (MRI) apparatus 10 for the purpose of orientation. Therein, a main field coil 12 establishes a steady uniform longitudinally directed magnetic field in an elongated measuring space 14. The approximate range of field strengths in present MRI equipment is in the range of 0.1 to 4.0 Tesla. Main field coil 12 may be superconducting, rather than resistive, in which case power supply 16 is used solely for initiating the necessary coil current. Also acting upon measurement space 14 are a system of three independently controllable gradient field coils 18 producing longitudinally directed fields with strengths that varies linearly in respective three orthogonal directions, in proportion to the respective coil currents driven by power supply 20. An RF coil 22 receives RF pulses formed in RF transmitter section 24 via Transmit/Receive switch 26 and transmits these pulses into measurement space 14. As is well known, these RF pulses are at the Larmor frequency determined by the strength of the main field and the nuclei of interest (usually water protons). RF coil 22 receives the resultant spin resonance signals from the measurement sapce and via switch 26 feeds these signals to receiver section 28 where they are detected and then sampled and digitized by an A/D converter 30. A sequence controller controls gradient power supply 20, Transmit/Receive switch 26, RF transmitter section 24 and RF receiver section 28 so as to subject measurement space 14 to a sequence of sub-experiments, each including at least a read or excitation RF pulse for converting some or all longitudinal magnetization to transverse magnetization, and gradient pulses functioning as one or more phase encoding gradients (the time integral of which is stepped from each sub-experiment to the next) followed by a read gradient during which spin resonance signals are sampled by the A/D converter 30.

Typically, for angiography using a time-of-flight procedure, the sequence is configured to induce spin resonance signals of relatively high amplitude from voxels through which blood is flowing than from voxels containing only stationary tissue. A so-called 2D "multislice" collection is commonly utilized in which a slice-selective sequence is applied sequentially to a stack of a plurality of (for example, four) equally spaced apart parallel slices, of known thickness. In a slice-selective sequence, at least the RF read pulse is applied simultaneously with a slice-selection gradient. The result of the multislice collection is a two-dimensional array (containing, for example, 256×256 points in a spatial frequency space known as K-space) of signal samples for each slice, so that the multi-slice collection is effectively a three dimensional array of signal samples which are supplied by A/D converter 30 to digital memory 32. The signal sample data for each slice is separately subjected to a two dimensional Fourier Transform in block 34, which may constitute an array processor, to produce a two-dimensional array of pixel intensities for each slice. As a result, the collection of pixels for multiple parallel slices supplied by block 34 to digital memory 36 can be considered a three-dimensional array of voxel intensities (of, for example, 4×256×256 points).

In the case of the use of either a 3D time-of-flight method or 3-D phase-sensitive method, a three-dimensional array of sample points in K-space is read into memory 32 with usually one of the dimensions, which is referred to herein as vertical, being quantized by less points that the other dimensions. This three-dimensional K-space array is then subjected in block 34 to a three-dimensional Fourier Transform to produce the three dimensional array of voxel intensities in memory 36.

This three-dimensional array of voxel intensities is operated upon by an image processor 38 to supply to digital memory 40 a two-dimensional array of pixel intensities which are displayed on a display device 42, such as a CRT. Image processor includes program modules for various functions including background suppression 38a, interpolation 38b and projection 38c, which are pertinent to angiography.

Figure 2:
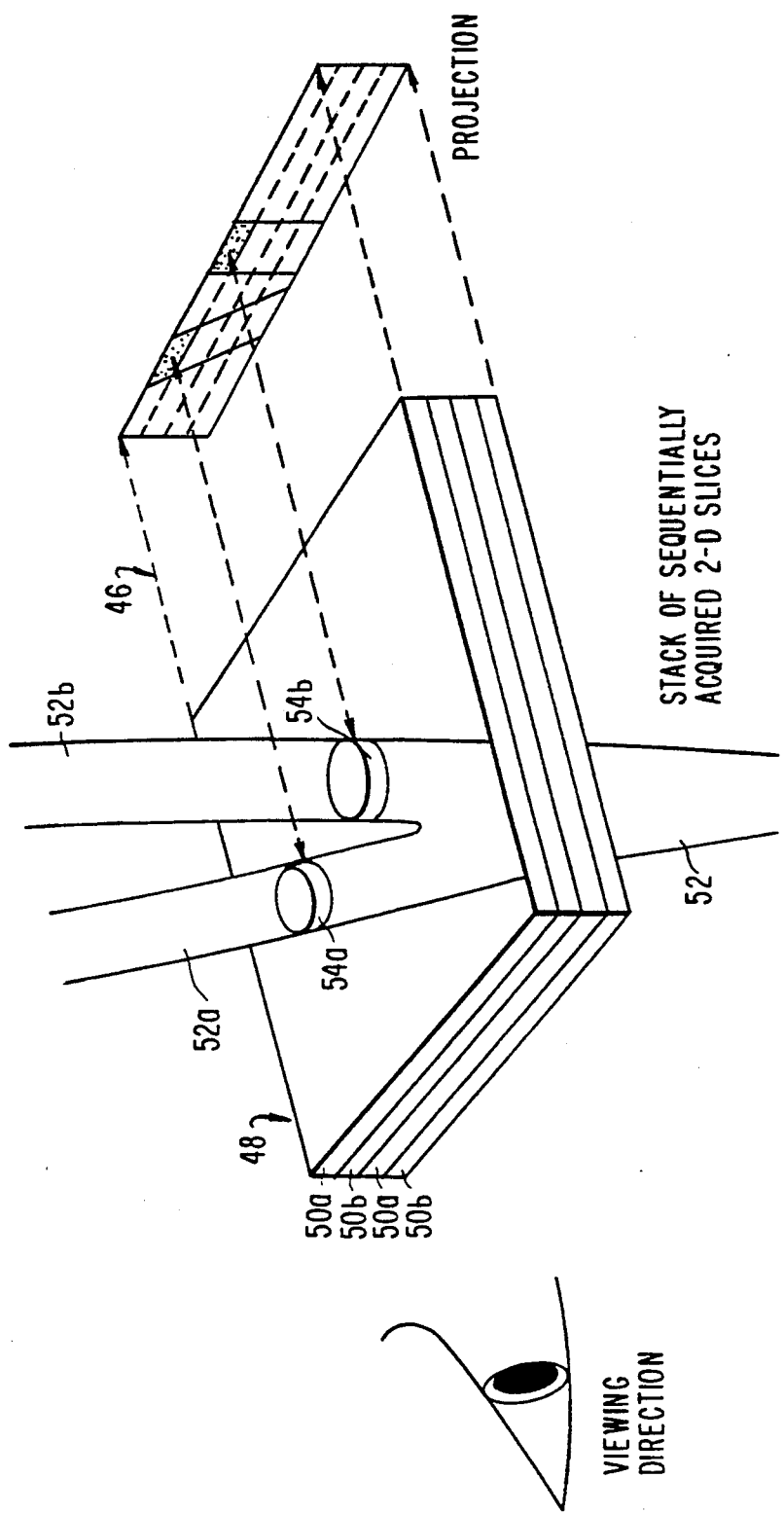
FIG. 2 is an illustration of the production of an angiogram by projection.

FIG. 2 illustrates application of projection module 38c to produce a two-dimensional array of pixels for display as an angiogram 44 which is obtained by projecting parallel rays in a viewing direction 46 through a three-dimensional array 48 of voxels which are pixels of four stacked slices 50a through 50d, each ray producing an associated pixel of the angiogram. For purposes of illustration, a three dimensional intensity pattern corresponding to flowing blood 52 within a vessel is positioned intersecting three dimensional array 48. As a result of the projection procedure, the voxels making up the disc shaped volumes 54a, 54b of vessel branches 52a, 52b within slice 50a, project respectively to pixels making up the areas 54a, 54b of angiogram 44. The common projection technique for MR angiography is maximum intensity projection (MIP). In MIP, the intensity of each pixel in the angiogram is taken as the maximum intensity of the voxels through which the associated ray passes. As, is apparent, in the absence of interpolation either before or after projection, the angiogram produced in a horizontal viewing direction would be only four voxels high.

Figure 3:
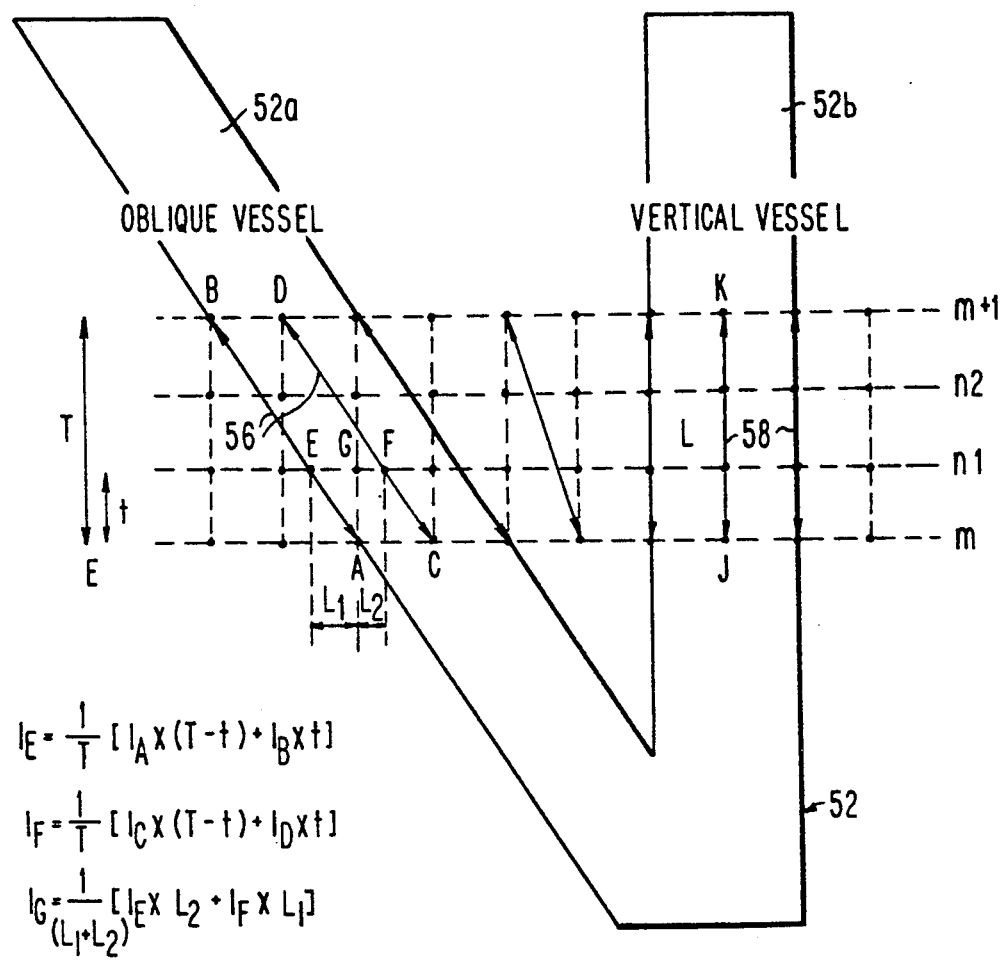
FIG. 3 is a two dimensional representation of local directions of interpolation relative to blood vessels in an 2D array of pixels obtained after projection, according to the principles of the present invention.

FIG. 3 illustrates a linear interpolation operation carried out by interpolation module 38b when applied to interpolate, for example, a pair of additional lines n1, n2 of pixels between each original pair of adjoining parallel lines m, m+1 of pixels in a preliminary angiogram produced by projection module 38a. As shown with respect to an oblique vessel branch 52a and a vertical vessel branch 52b, local interpolation directions along lines 56 are utilized within and proximate to vessel or branch 52. These local interpolation directions, rather than being vertical, are oblique and tend to be parallel with the axis of branch 52. These local directions are based on a determination of correspondence of pixels in line m with pixels in line m+1, and the connection of these corresponding pixels with lines 56. For example, pixels A and C in line m respectively correspond with pixels B and D in line m+1 based on their positions in the intensity patterns along the lines. By connecting the centers of pixels A and C respectively to the centers of pixels B and D with straight lines 56, the points E, F of intersection of lines 56 with line n1 are determined. Points E and F are typically intermediate actual pixel centers. Then, hypothetical intensities $I_E$, $I_F$ of points E, F respectively and therefrom, the intensity $I_G$ of pixel G on line n1 between points E and F are determined from the following relationships, where $I_A$ through $I_D$ are the intensities of pixels A through D:

$$I_E = [I_A \times (T-t) + I_B \times t]/T$$

$$I_F = [I_C \times (T-t) + I_D \times t]/T$$

$$I_G = [I_E \times L_2 + I_F \times L_1]/(L_1 + L_2)$$

where as shown in FIG. 3:
t is the distance between line m and the line containing G;
T is the distance between lines m and m+1;
L1 is the distance between points E and G; and
L2 is the distance between points G and F.

Thus, with the oblique direction of interpolation illustrated, the intensity of any pixel G of an interpolated line is a function of the intensities of four pixels, A through D, of the original lines below and above the interpolated line. It is this oblique direction of interpolation which tends to eliminate the staircase artifact present in the edges of oblique vessels as they appear in MR angiograms produced by interpolation.

It should be understood that the intensities $I_E$ and $I_F$ of the intermediate points E and F could be found from the corresponding pixels in more than two lines, for example the corresponding points in a line m−1 and line m+2 (not shown) could be used at the same time and a third order spline fit to the intensities at the corresponding points. In such case, the intensity $I_G$ determined for an interpolated pixel G is a function of the intensities of two pixels from each of the four original lines (m−1, m, m+1 and m+2) used to determine the intensities $I_E$ and $I_F$ of intermediate points E and F.

To interpolate pixels not within or proximate an oblique branch or vessel, a vertical interpolation procedure is used which is conventional although contrary to the principles of the present invention, it was heretofore used for all pixels irrespective of their location relative to anatomy or intensity patterns. By vertical interpolation, the intensity $I_L$ of an interpolated pixel L is determined from the intensities $I_J$ and $I_K$ of the two original pixels J (line m) and K (line m+1) directly below and above pixel L, from the following relationship, where t and T have the same definitions as previously given:

$$I_L = [I_J \times (T-t) + I_K \times t]/T$$

Figure 4A:
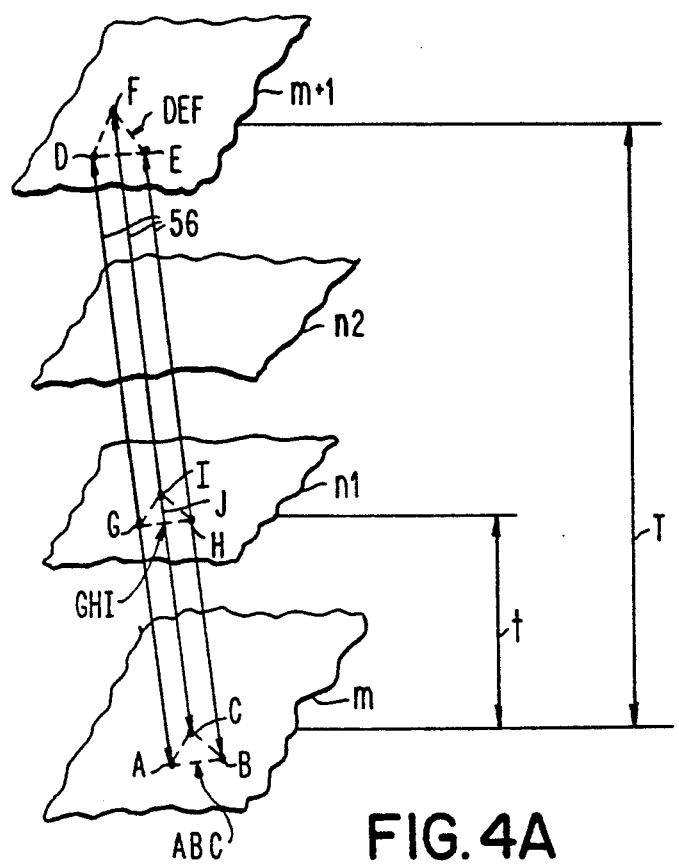
FIG. 4A is a three dimensional representation of oblique interpolation relative to a 3D array of voxels prior to projection, in accordance with the principles of the present invention.

FIG. 4A illustrates interpolation of additional planes or slices n1 and n2 between original planes or slices m and m+1 of the three dimensional array of voxels prior to projection. It is an extension of the discussion concerning FIG. 3 to three dimensions. An oblique direction of interpolation is shown where voxels D, E and F forming a triangle DEF in plane m+1 have been determined based on intensity patterns to correspond respectfully to voxels A, B and C forming a right triangle ABC in plane m. The lines 56 between corresponding voxels of these two triangles intersect plane n1 at points G, H and I forming a triangle GHI.

Figure 4B:
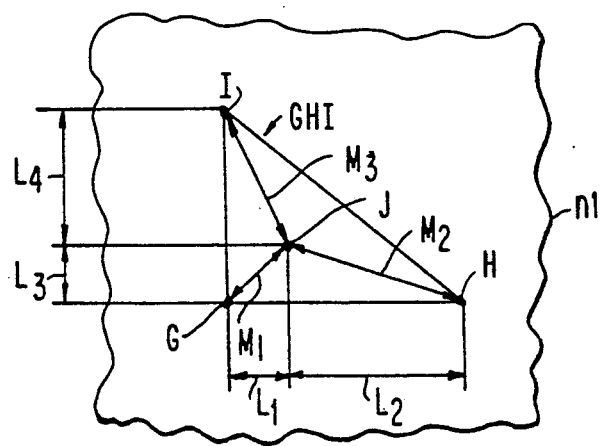
FIG. 4B is a plan view of a plane in FIG. 4A.

As better shown in FIG. 4B, points G, H and I are in general intermediate actual voxel points to be interpolated. The hypothetical intensities of points G, H and I and therefrom, the intensity of a voxel J within triangle GHI are determined as an extension of the relationships discussed with respect to FIG. 3 as a function of the between plane distances t and T. One such extension is mathematically equivalent to averaging the intensities of the interpolated voxels by separately applying the relationships discussed with respect to FIG. 3 in each of the two in-plane orthogonal directions, using $L_1$, $L_2$ in one calculation and $L_3$, and $L_4$ in the other. Alternatively, the intensity of pixel J may be determined as a function of the distances $M_1$, $M_2$ and $M_3$ from voxels J to points G, H and I.

As will become clearer as the discussion proceeds, a key aspect of the present invention is the determination of corresponding pixels in different lines or corresponding voxels in different planes based on local intensity patterns. This correspondence is determined by a search process illustrated in FIG. 5, which is conveniently discussed in terms of determination of corresponding pixels in adjoining lines in a two dimensional array applicable to interpolation after projection. It should be understood that this discussion is equally applicable to the determination of corresponding voxels in adjoining planes in a three dimensional array, applicable to interpolation prior to projection. The extension of a one dimensional search process to two dimensions is self evident.

Figure 5:
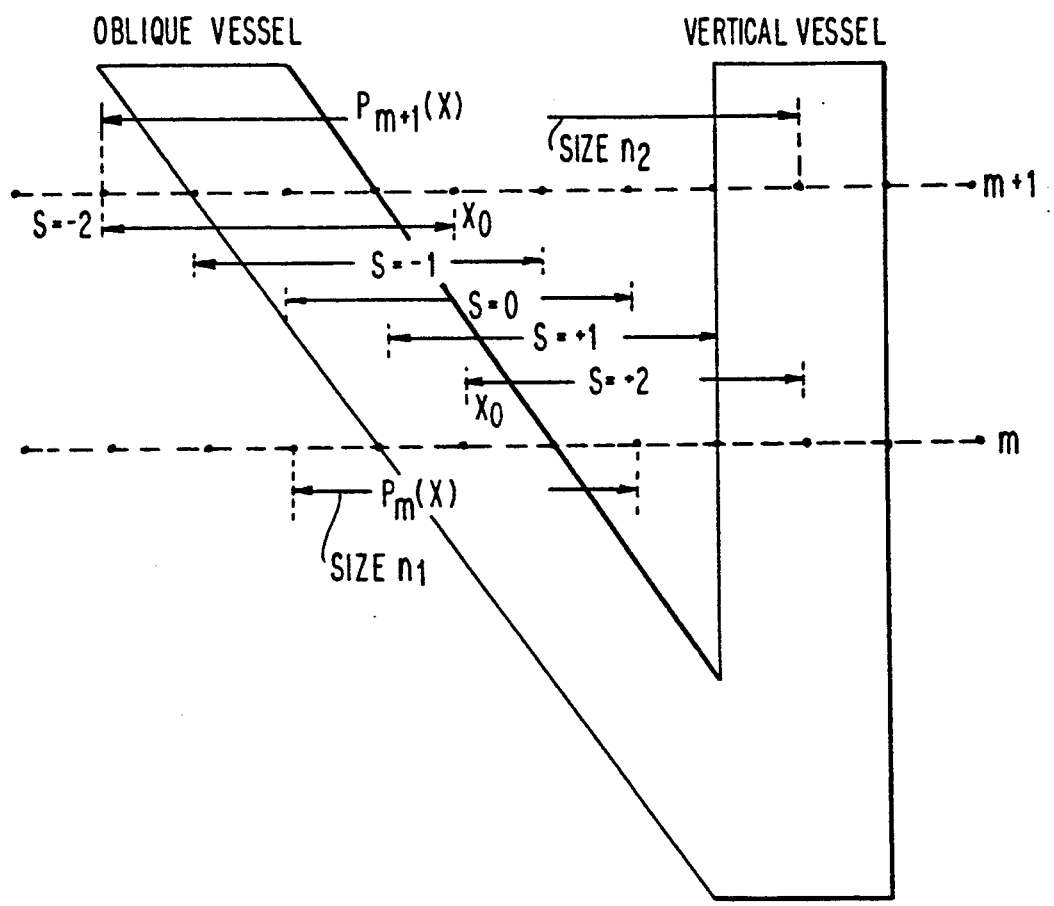
FIG. 5 is a pictorial representation showing a first group of pixels or voxels and a search window containing second groups of pixels or voxels which are compared to the first group in determining correspondence.

FIG. 5 illustrates the matching process between two lines, where the lines are denoted by m and m+1. The goal is to find for each point on line m the corresponding point on line m+1. The figure illustrates matching for the point at x coordinate $x_0$. This is performed by placing a reference window of size $n_1$ that is centered at the point $x_0$, on line m. A larger search window of size $n_2$ is centered at the point $x_0$, on line m+1. These windows are represented by $P_m(X)$ and $P_{m+1}(X)$, respectively. The first number in parenthesis denotes the center coordinate of the window. A number of measures can be used to estimate the degree of the match. For a pair of windows the root mean square error (rmse) or the correlation coefficient can be calculated for every shift value, s, where the smaller window has a complete overlap with the larger window. The shift, s, is relative to the center of the reference window. The rmse is then calculated by:

$$\hat{e}(s) = \sqrt{\frac{1}{n_1} \cdot \sum_{x=x_0-\frac{n_1}{2}}^{x_0+\frac{n_1}{2}} [P_m(x) - P_{m+1}(x+s)]^2}$$

where the range for the window shifts is:

$$\frac{-(n_2 - n_1)}{2} \leq s \leq \frac{(n_2 - n_1)}{2}$$

and the normalized rmse is given by:

$$e(s) = \frac{\hat{e}(s)}{\max_s (\hat{e}(s))}$$

where $e(s) \in [0,1]$. The best match is the value of s for which e is minimum.

Similar to the rmse, the correlation coefficient can be calculated at every point of complete overlap between the two windows. Let $\bar{P}_m$ and $\bar{P}_{m+1}$ represent the average values of pixels in the two windows. Let:

$$W_m(X) = P_m(X) - \bar{P}_m(X)$$

and:

$$W_{m+1}(x) = P_{m+1}(x) - \bar{P}_{m+1}(x)$$

The correlation coefficient is then given by:

$$\rho(s) = \frac{\sum_{x=x_0-\frac{n_1}{2}}^{x_0+\frac{n_1}{2}} W_m(x) W_{m+1}(x+s)}{\sqrt{\sum_{x=x_0-\frac{n_1}{2}}^{x_0+\frac{n_1}{2}} W_m^2(x) \sum_{x=x_0-\frac{n_1}{2}}^{x_0+\frac{n_1}{2}} W_{m+1}^2(x+s)}}$$

The correlation coefficient $\rho$ is bounded in the range [−1,1]. It is +1 for positively correlated and −1 for negatively correlated windows. The correlation coefficient is insensitive to window intensity averages. Thus, a transition from low to mid-gray can be matched to one from mid-gray to bright. The normalized rmse is sensitive to average window intensity levels, but is insensitive to changes in contrast. A combination of correlation coefficient and normalized rmse may provide a more robust method for template matching. Combined measures can be $(\rho - e)$, or weighted differences of the two measures, etc.

The matching and interpolation method, as described, can cause a directional texture appearance in the background noise regions. A control parameter in the algorithm was designed to avoid this problem. The background noise in MRA images is random and can be approximated by a Gaussian. The strength of the match in a background region is often much weaker than in regions containing flow. Therefore, one can avoid artifacts by looking at the degree of the match and comparing it with a preset threshold. If the match is better than the threshold it is accepted. Otherwise, the calculated match is ignored and the default vertical match is assumed. For example, the normalized rmse can lie in the range 0 to 1, where the strongest match is 0, and the weakest is 1. Suppose that normalized rmse is the match criterion, and that a threshold of 0.5 is chosen. Then all matches with rmse values greater than 0.5 are assumed to be in background regions, and a zero shift vertical match is imposed. If the underlying assumption that match strengths in flow regions are better than the threshold is violated, directional interpolation is not carried out for those flow regions as well.

Figure 6:
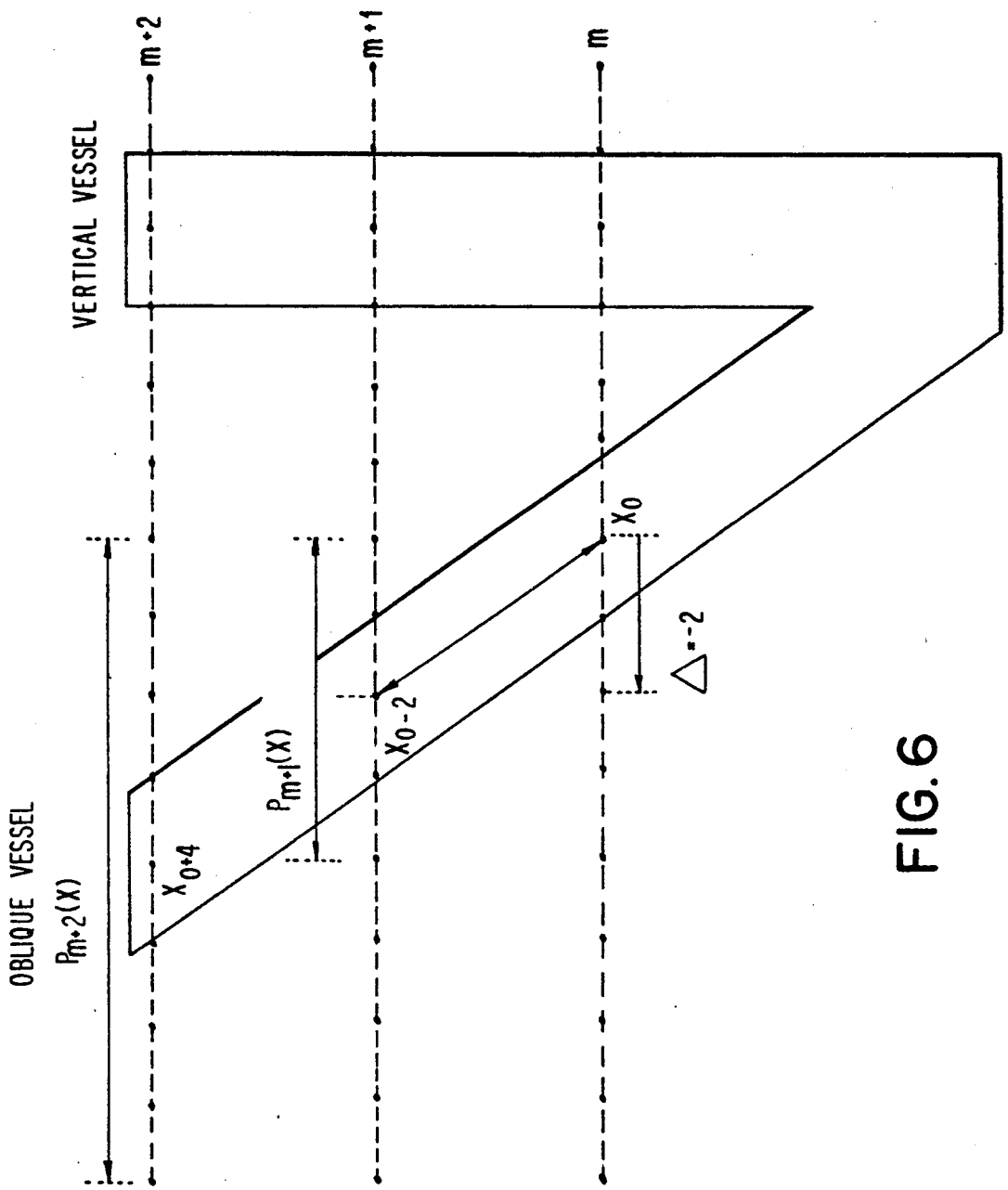
FIG. 6 is pictorial representation similar to FIG. 5, but with the center of the search window center biased in position.

A variation on the method is to use the match information from previous lines to bias the direction of the search. As shown in FIG. 6 is an approach m+1 to points on line m+2. In the previous line matching iteration, the point $x_0$ on line m was matched to the point $x_{0-2}$ on line m+1. This match represents a shift $\Delta = -2$. The center of the search window on line m+2 is shifted by the value of the bias, $\Delta$, which is −2 in this figure. The search window is, therefore, centered on the point $x_{0-4}$. In the general case of such an approach the range for possible shifts, s, is given by:

$$\frac{-(n_2 - n_1)}{2} + \Delta \leq s \leq \frac{(n_2 - n_1)}{2} + \Delta$$

The bias effectively increases the search range in one direction, while reducing it in the other. Given a fixed search window size, the bias increases the change of finding the right match if the vessel shifts larger distances in the same direction as the previous line. However, it reduces the chance of finding the right match if the vessel suddenly curves in the opposite direction. An alternative (not shown in FIG. 7) is to adaptively increase or decrease the size of the search window based on prior matches. For example, if the previous match is close to the edge of the search window, the search window size is increased. Another variation is to use the matching information from the previous point on the same line to bias the match.

Figure 7:
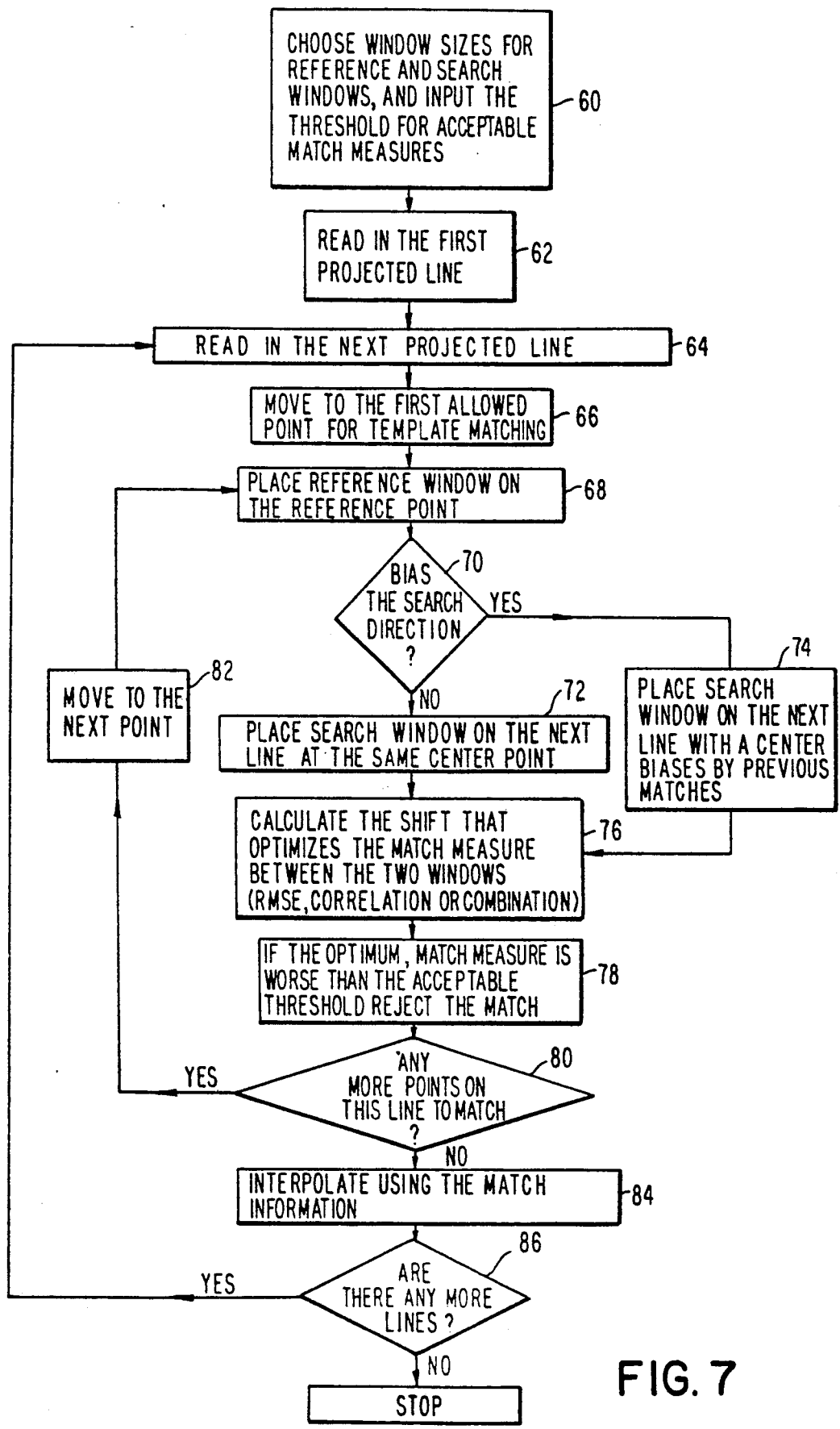
FIG. 7 is a flow chart of the directional interpolation method of the present invention.

FIG. 7 is a flow chart, which is self explanatory, of the method of determining corresponding pixels which determines one or more interpolated lines between present and next lines of a projection image once all corresponding pixels have been found in these present and next lines. As shown, first in block 60 window sizes and threshold for the match measure are selected. The window sizes thus far found preferable are $n_1 = 11$ and $n_2 = 17$. However these parameters should be optimized for particular anatomy and protocols. An appropriate threshold for the match measure depends on whether background suppression is performed prior to interpolation and should also be optimized for the particular anatomy and protocol.

In blocks 62 and 64, a first and sequential next lines of pixels are read. In block 66, there is a move to the first allowed point on the present line for reference matching. Blocks 68 through 80 are within an inner loop which sequentially determines corresponding points in the next line to the present line. In block 70 through 74, the search may be carried out either biased as illustrated in FIG. 6 or not biased as in FIG. 5, depending on the selection made in box 70. The optimum match measure selected in box 76 is preferably the closest of multiple thereof. In block 78, when a match is rejected, the default of a vertical match is taken. After the inner loop comprising blocks 68 through 80, an interpolated line is determined in block 84. As should now be apparent, an outer loop comprising blocks 64 through 88 in response to each read in of a next line, determines the one or more interpolated lines between the present line and this next line.

As previously noted, it should be apparent that the flow chart of FIG. 7 is easily extended to three dimensions by any desired pattern of searching over the shifts in each of two dimensions for the optimum match measure.

It should also be apparent that although the present invention has been described in detail with respect to MR angiography, many principles thereof are applicable to other medical imaging modalities such as CT. Further, numerous modifications in the details given are possible within the intended spirit and scope of the invention.

What is claimed is:

1. An angiography method comprising:
   inducing radiation to radiate from voxels of a region of a body under examination having intensities influenced by any flowing blood within said voxels, said flowing blood being in blood vessels, said voxels having center to center spacing in respective three orthogonal directions;
   receiving and sampling the radiation radiating from the voxels of said region as a collection of signal samples;
   converting said collection of signal samples into a three dimensional array of computed voxel intensities, each dimension of said array corresponding to a different one of said three orthogonal directions;
   forming a preliminary two dimensional array of pixels as a function of the positions and intensities of the measured voxels; and
   interpolating between first and second parallel lines of pixels in the preliminary two dimensional array, an additional line of interpolated pixels in forming an expanded two dimensional pixel array for display as an angiogram;
   wherein said interpolating is carried out by determining for each pixel in said first line whether a pixel exists in said second line which corresponds in position to the pixel in the first line with respect to local intensity patterns, and by using a local direction of interpolation directed between the pixel in said first line and a pixel in the second line determined to correspond thereto, and in the absence of a pixel in the second line determined to correspond thereto using a local direction of interpolation along a perpendicular to said first and second lines;
   whereby local directions of interpolation tend to be parallel to axes of proximate blood vessels.

2. The method as claimed in claim 1, wherein said determining comprises forming a match measure between a first group of consecutive pixels in said first line, which first group includes in a predetermined relative position in said first group, the pixel for which the existence of a corresponding pixel in said second line is being determined, and each of a plurality of second groups of consecutive pixels, which second groups are successively shifted in position in said second line, and identifying as a corresponding pixel in said second line, the pixel in the same predetermined relative position in the second group having a best match measure of the plurality of second groups, if said best match measure is better than a predetermined threshold value.

3. The method as claimed in claim 2, wherein said forming of said match measure with respect to a second group comprises forming a sum over the respective same relative positions in the first and second groups, of the square of the differences between intensities of pixels having the same relative positions in the respective first and second groups.

4. The method as claimed in claim 3, wherein said forming of said match measure with respect to a second group comprises forming a sum over the respective same relative positions in the first and second groups, of products of intensities of pixels at the same relative positions in the respective first and second groups biased by mean intensities applicable to said respective first and second groups.

5. The method as claimed in claim 2, wherein said forming of said match measure with respect to a second group comprises forming a sum over the respective same relative positions in the first and second groups, of products of intensities of pixels at the same relative positions in the respective first and second groups biased by mean intensities applicable to said respective first and second groups.

6. The method as claimed in claim 2, wherein said forming a preliminary two dimensional display array of pixels is by determining the maximum intensity of voxels along parallel rays directed in a viewing direction;

7. The method of claim 2, wherein said induced and received radiation are MR spin resonance RF signals.

8. The method as claimed in claim 1, wherein said forming a preliminary two dimensional display array of pixels is by determining the maximum intensity of voxels along parallel rays directed in a viewing direction;

9. The method of claim 1, wherein said induced and received radiation are MR spin resonance RF signals.

10. An angiography method comprising:
    inducing radiation to radiate from voxels of a region of a body under examination with intensities influenced by any presence of flowing blood within said voxels, said flowing blood being in blood vessels, said voxels having center to center spacing in respective three orthogonal directions;;
    receiving and sampling the radiation radiating from said voxels as a collection of signal samples;
    converting said collection of signal samples into a three dimensional array of computed voxel radiation intensities, each dimension of said array corresponding to a different one of said three orthogonal directions;
    interpolating an additional plane of voxels between first and second adjoining parallel planes of said computed voxels in forming an expanded voxel array; and
    forming a two dimensional display array of pixels, for display as an angiogram, as a function of the positions and intensities of the voxels in the expanded voxel array;

wherein said interpolating is carried out by determining for each pixel in said first plane whether a pixel exists in said second plane which corresponds in position to the pixel in the first line with respect to local intensity patterns, and by using a local direction of interpolation directed between the pixel in said first plane and a pixel in the second plane determined to correspond thereto, and in the absence of a pixel in the second plane determined to correspond thereto using a local direction of interpolation along a normal to said first and second planes;

whereby local directions of interpolation tend to align parallel to axes of proximate blood vessels.

11. The method as claimed in claim 10, wherein said determining comprises forming a match measure between a first group of consecutive pixels in said first plane, which first group includes in a predetermined relative position in said first plane, the pixel for which the existence of a corresponding pixel in said second plane is being determined, and each of a plurality of second groups of consecutive pixels, which second groups are successively shifted in position in said second plane, and identifying as a corresponding pixel in said second plane, the pixel in the same predetermined relative position in the second group having a best match measure of the plurality of second groups, if said best match measure is better than a predetermined threshold value.

12. The method as claimed in claim 11, wherein said forming of said match measure with respect to a second group comprises forming a sum over the respective same relative positions in the first and second groups, of the square of the differences between intensities of pixels having the same relative positions in the respective first and second groups.

13. The method as claimed in claim 12, wherein said forming of said match measure with respect to a second group comprises forming a sum over the respective same relative positions in the first and second groups, of products of intensities of pixels at the same relative positions in the respective first and second groups biased by mean intensities applicable to said respective first and second groups.

14. The method as claimed in claim 11, wherein said forming of said match measure with respect to a second group comprises forming a sum over the respective same relative positions in the first and second groups, of products of intensities of pixels at the same relative positions in the respective first and second groups biased by mean intensities applicable to said respective first and second groups.

15. The method as claimed in claim 11, wherein said forming a two dimensional array of pixels is by determining the maximum intensity of voxels along parallel rays directed in a viewing direction.

16. The method of claim 11, wherein said induced and received radiation are MR spin resonance RF signals.

17. The method as claimed in claim 10, wherein said forming a two dimensional array of pixels is by determining the maximum intensity of voxels along parallel rays directed in a viewing direction.

18. The method of claim 10, wherein said induced and received radiation are MR spin resonance RF signals.

19. Magnetic resonance angiography apparatus comprising:

means for inducing magnetic resonance signals to radiate from voxels of a region of a body under examination having intensities influenced by any flowing blood within said voxels, said voxels having center to center spacing in respective three orthogonal directions;

means for receiving and sampling the magnetic resonance signals radiating from the voxels of said region as a collection of signal samples;

means for converting said collection of signal samples into a three dimensional array of computed voxel intensities, each dimension of said array corresponding to a different one of said three orthogonal directions;

means for forming a preliminary two dimensional array of pixels as a function of the positions and intensities of the measured voxels; and means for interpolating between first and second parallel lines of pixels in the preliminary two dimensional array, an additional line of interpolated pixels in forming an expanded two dimensional pixel array for display as an angiogram;

wherein said interpolating means comprises means for determining for each pixel in said first line whether a pixel exists in said second line which corresponds in position to the pixel in the first line with respect to local intensity patterns, and for using a local direction of interpolation directed between the pixel in said first line and a pixel in the second line determined to correspond thereto, and in the absence of a pixel in the second line determined to correspond thereto for using a local direction of interpolation along a perpendicular to said first and second lines;

whereby local directions of interpolation tend to be parallel to axes of proximate blood vessels.

20. MR angiography apparatus comprising:

means for inducing MR spin resonance RF signals to radiate from voxels of a region of a body under examination with intensities influenced by any presence of flowing blood within said voxels, said voxels having center to center spacing in respective three orthogonal directions;

means for receiving and sampling the MR spin resonance RF signals radiating from said voxels as a collection of signal samples;

means for converting said collection of signal samples into a three dimensional array of computed voxel radiation intensities, each dimension of said array corresponding to a different one of said three orthogonal directions;

means for interpolating an additional plane of voxels between first and second adjoining parallel planes of said computed voxels in forming an expanded voxel array; and means for forming a two dimensional display array of pixels, for display as an angiogram, as a function of the positions and intensities of the voxels in the expanded voxel array;

wherein said interpolating means comprises means for determining for each pixel in said first plane whether a pixel exists in said second plane which corresponds in position to the pixel in the first line with respect to local intensity patterns, and for using a local direction of interpolation directed between the pixel in said first plane and a pixel in the second plane determined to correspond thereto, and in the absence of a pixel in the second plane determined to correspond thereto for using a local direction of interpolation along a normal to said first and second planes;

whereby local directions of interpolation tend to be parallel to axes of proximate blood vessels.

* * * * *